United States Patent
Lee et al.

(10) Patent No.: US 11,315,788 B2
(45) Date of Patent: Apr. 26, 2022

(54) ETCHING METHOD FOR FORMING MICRO SILICON PATTERN IN SEMICONDUCTOR MANUFACTURING PROCESS

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR)

(73) Assignee: YOUNG CHANG CHEMICAL CO., LTD, Gyeongsangbukdo (KR)

( * ) Notice: Subject to any disclaimer, the term of this patent is extended or adjusted under 35 U.S.C. 154(b) by 48 days.

(21) Appl. No.: 16/961,450

(22) PCT Filed: Jan. 9, 2019

(86) PCT No.: PCT/KR2019/000308
§ 371 (c)(1),
(2) Date: Jul. 10, 2020

(87) PCT Pub. No.: WO2019/146936
PCT Pub. Date: Aug. 1, 2019

(65) Prior Publication Data
US 2021/0082701 A1    Mar. 18, 2021

(30) Foreign Application Priority Data
Jan. 23, 2018  (KR) .................. 10-2018-0008263

(51) Int. Cl.
*H01L 21/033*  (2006.01)
*H01L 21/027*  (2006.01)
(52) U.S. Cl.
CPC ...... *H01L 21/0338* (2013.01); *H01L 21/0274* (2013.01); *H01L 21/0335* (2013.01); *H01L 21/0337* (2013.01)

(58) Field of Classification Search
CPC ............ H01L 21/0335; H01L 21/0337; H01L 21/0338; H01L 21/0274; H01L 21/3081
See application file for complete search history.

(56) References Cited

U.S. PATENT DOCUMENTS

| 6,153,358 | A | 11/2000 | Zhang et al. |
| 2001/0024883 | A1 | 9/2001 | Huang et al. |
| 2005/0103748 | A1* | 5/2005 | Yamaguchi ....... H01L 21/31116 216/67 |

FOREIGN PATENT DOCUMENTS

| KR | 10-2006-0011392 A | 2/2006 |
| KR | 10-2006-0131131 A | 12/2006 |
| KR | 10-2014-0138581 A | 12/2014 |

* cited by examiner

*Primary Examiner* — Walter H Swanson
(74) *Attorney, Agent, or Firm* — Novick, Kim & Lee, PLLC; Jae Youn Kim

(57) ABSTRACT

A process of realizing a silicon micropattern having a large aspect ratio in a semiconductor-manufacturing process, and a novel wet etching method that includes treating an organic carbon film layer so that a hydrofluoric-acid-resistant material is selectively attached to the organic carbon film layer and then wet etching the same using an aqueous solution containing hydrofluoric acid, thus forming a pattern, are proposed. In the method of forming the pattern by wet etching, etching is performed so that an active region having a depth of several μm in an object to be etched is not damaged when a pattern having a small CD is formed, thereby exhibiting an effect of providing a method of forming a micropattern.

7 Claims, No Drawings

ETCHING METHOD FOR FORMING MICRO SILICON PATTERN IN SEMICONDUCTOR MANUFACTURING PROCESS

TECHNICAL FIELD

The present invention relates to a novel wet etching method of forming a silicon or silicon compound micropattern in a semiconductor-manufacturing process. The method includes coating an organic carbon film pattern with a hydrofluoric-acid-resistant material so that the hydrofluoric-acid-resistant material is selectively attached to the organic carbon film pattern and then wet etching the resultant organic carbon film pattern using an aqueous solution containing hydrofluoric acid, thus forming the pattern.

BACKGROUND ART

Recently, micropatterns have been required to be realized in accordance with the size reduction and integration of semiconductor devices. As a method of forming such a micropattern, the size reduction of photoresist patterns through the development of exposure apparatuses or the introduction of additional processes is useful.

In a process of manufacturing a semiconductor, to date, a pattern has been formed on a semiconductor substrate using an i-line light source having a wavelength of 365 nm. However, a light source in a smaller wavelength band is needed in order to form a finer pattern.

Practical development of lithography using an ArF light source (198 nm) and a EUV (extreme ultraviolet, 13.5 nm) light source commenced with lithography using a KrF light source (248 nm), and a double-exposure technology of ArF lithography (double-patterning lithography) has been also developed. These technologies are now commercially available or are being commercialized, and finer patterns may be realized using the same.

When a photoresist having a large thickness (>500 nm) is used as in a conventional technology in order to realize a silicon micronized pattern having a large aspect ratio, the pattern collapses as the pattern aspect ratio of the photoresist is increased, which acts as a hindrance to the realization of a silicon pattern having a large aspect ratio. With respect to the collapse of the pattern, when the thickness of the photoresist is reduced, the photoresist does not sufficiently act as a mask for a substrate in a subsequent dry etching process. For this reason, it is not possible to form a pattern having the depth required to realize the pattern.

In order to solve this problem, materials of an amorphous carbon film (ACL: amorphous carbon layer) or an organic carbon film, which is called a hardmask, such as SOC (spin on carbon) or SOH (spin on hardmask) are used to perform a process. However, this process has a limitation in forming a silicon pattern having a greater depth.

To this process, a method of forming a film to be etched and then forming a pattern through selective dry etching using a plasma is applied.

The sequence of the process will be described in brief. A SOC layer, which is an organic carbon film, is applied on a substrate layer, a SiON layer, which is an inorganic film, is deposited using a chemical vapor deposition method, and a photoresist is applied thereon, followed by exposure, thus performing patterning. The SiON layer is etched with a halogen plasma using the patterned photoresist. Thereafter, the organic carbon film layer is etched with an oxygen plasma, and the final substrate layer is etched with a halogen plasma so that the depth of the pattern is increased.

When the halogen plasma is used, an etching speed is faster in the case of the SiON layer, which is the inorganic film, than in the case of the photoresist, which is the organic film, so that a desired pattern is transferred even with a thin photoresist. When the oxygen plasma is used, the speed is faster in the case of the SOC layer, which is the organic carbon film, than in the case of the SiON layer, so that etching is easily performed.

Since the final substrate layer includes Si, $SiO_2$, or SiN, transferring is performed so that the depth of the pattern is increased using the halogen plasma that more easily etches the substrate layer compared to the carbon film.

In a process of introducing a hard mask in order to realize a micronized pattern, as the pattern becomes finer, the aspect ratio of the pattern is increased, which causes a problem in a pattern that may be realized using a dry etching process. In order to form the micropattern, the substrate layer needs to have a greater depth. In order to obtain the greater depth using a dry etching process, thicknesses of a photoresist layer, an organic carbon film layer, and an ACL layer must be increased. In the case of an ArF or KrF PR, there is a limit in increasing the thickness due to the structure of the resin thereof unlike an i-line PR. When the thickness of the organic carbon film layer is increased, the pattern may be warped or broken during the dry etching process, making it impossible to apply the process. Further, deposition time and costs need to be increased in order to increase the thickness of the ACL layer, which reduces the production cost and efficiency. Above all, the thickness that may be realized is limited, and thus it is impossible to etch a silicon or silicon compound layer having a depth of tens of μm, which is greater than a depth of several μm, in order to form a current pattern having a large aspect ratio and a width of tens or hundreds of nm.

The inventor of the present invention has focused on this and has conducted research on the development of a new process in order to realize a silicon or silicon compound micropattern having a large aspect ratio that is not obtainable by a conventional process. As a result of the research, the inventor determined the evaluation that wet etching has a faster etching speed and is more stable compared to dry etching in terms of processes and that wet etching is more economical in terms of costs than dry etching, thereby developing a technology for forming finer patterns using a wet method.

DISCLOSURE

Technical Problem

The present invention relates to a novel wet etching method of forming a silicon or silicon compound micropattern in a semiconductor-manufacturing process. The method includes coating an organic carbon film layer with a hydrofluoric-acid-resistant material so that the hydrofluoric-acid-resistant material is selectively attached to the organic carbon film layer and then wet etching the resultant organic carbon film layer using an aqueous solution containing hydrofluoric acid, thus forming the pattern.

Technical Solution

The present invention relates to a method of forming a desired pattern. The method includes coating an organic carbon film layer, which remains after a photoresist pattern is etched, with a hydrofluoric-acid-resistant material so that the hydrofluoric-acid-resistant material is selectively attached to the organic carbon film layer, and then wet etching the resultant organic carbon film layer using an aqueous solution containing hydrofluoric acid, thus forming the pattern.

In more detail, in a process of etching a silicon or silicon compound layer in a semiconductor-manufacturing process, an organic film and an inorganic film are sequentially layered in appropriate thicknesses on an object to be etched. First, coating of the organic carbon film layer containing a large amount of carbon is performed, deposition using a chemical vapor deposition method is performed to form a SiON layer, and a photoresist is applied thereon to perform patterning. The SiON layer is etched with a halogen plasma using the patterned photoresist. Thereafter, the organic carbon film layer is etched with an oxygen plasma so that only a portion of a desired pattern depth is obtained.

Next, a hydrofluoric-acid-resistant reinforcing material is selectively attached to only the organic carbon film layer of the object to be etched, and is baked to form a protective film. Then, a substrate is secondarily wet-etched using the aqueous solution containing the hydrofluoric acid to form a desired pattern.

The organic carbon film refers to a film which is capable of being applied on a wafer using spin coating or a chemical or physical deposition method and which has a carbon content of 30 to 100%.

Among organic carbon film layers, the spin coating thickness of the SOC that is obtainable using the spin coating is not particularly limited, but the coating thickness may be 100 to 30,000 Å, and a bake process may be performed at a temperature of 150 to 400° C. for 1 to 5 minutes.

The SiON that is capable of being formed using the chemical or physical deposition method may be formed to a thickness of 100 to 10,000 Å under pressure of 0.01 to 10 ton using a plasma in a deposition apparatus.

The hydrofluoric-acid-resistant reinforcing material is polyimide, polyethylene, polypropylene, polyvinylidene, polyvinyl chloride, polyimidazole, polycarbonate, polystyrene, polyethylene terephthalate, polybutylene terephthalate, polyphenylene ether, or polyvinylidene fluoride. The hydrofluoric-acid-resistant reinforcing material may be any material that has resistance to hydrofluoric acid and is capable of being selectively applied on the organic carbon film.

Preferably, the spin coating thickness of the hydrofluoric-acid-resistant reinforcing material is 10 to 1,000 Å, and a bake process is performed at a temperature of 50 to 400° C. for 1 to 5 minutes.

When the spin coating thickness of the hydrofluoric-acid-resistant reinforcing material is less than 10 Å, since coating of the organic carbon film is reduced, the organic carbon film is etched by the hydrofluoric acid during a wet etching process using a hydrofluoric acid solution. Accordingly, a desired etching form is not obtained. On the other hand, when the spin coating thickness is more than 1000 Å, the hydrofluoric-acid-resistant coating material physically fills a space between the organic carbon film layers, in which the size of the pattern to be etched is tens to hundreds of nm, that is, a space between the patterns. Accordingly, it is impossible to perform etching using the hydrofluoric acid solution, so the above thickness is not applicable. Therefore, the inventor of the present invention found that the spin coating thickness of the hydrofluoric-acid-resistant reinforcing material is preferably 10 to 1,000 Å.

Moreover, the size of the pattern to be etched depends on the spin coating thickness of the hydrofluoric-acid-resistant reinforcing material applied on the organic carbon film. Accordingly, the inventor of the present invention confirmed that the size of the organic film pattern is preferably 10% or less in consideration of an etch margin of tens to hundreds of nm in the organic carbon film layer. As a result of long-term and continuous research, it was found that the spin coating thickness of the hydrofluoric-acid-resistant reinforcing material is more preferably 10 to 500 Å.

Advantageous Effects

In a novel wet etching method of forming a micropattern according to the present invention, after dry etching is performed so that an organic carbon film layer partially remains on a silicon or silicon compound layer, a hydrofluoric-acid-resistant reinforcing material is selectively attached to the remaining portion of the organic carbon film layer, thus forming a pattern protective film. The hydrofluoric-acid-resistant reinforcing material is a material that reacts with the organic carbon film layer, and serves to protect the surface of an organic carbon film, thus enhancing the corrosion resistance to hydrofluoric acid during wet etching. Accordingly, it is possible to form a desired silicon or silicon compound pattern having a high aspect ratio without collapsing or warping of the pattern during the wet etching process using hydrofluoric acid for the purpose of forming a micropattern.

BEST MODE

Hereinafter, the present invention will be described in more detail.

The present invention relates to a novel wet etching method of forming a silicon micropattern in a semiconductor-manufacturing process. In the method, a remaining organic carbon film is treated with a hydrofluoric-acid-resistant reinforcing material, and then wet etched using an aqueous solution containing hydrofluoric acid, thus forming the pattern.

The method of forming the micropattern using the novel wet etching according to the present invention includes the following steps: a step of forming an organic carbon film layer on a substrate layer, depositing a SiON layer using a chemical vapor deposition method, and applying a photoresist thereon, followed by exposure, thus forming a mask; a step of performing primary dry-etching using the mask so that only a portion of a desired pattern depth is obtained; a step of coating the substrate with a hydrofluoric-acid-resistant reinforcing material, followed by baking; and a step of secondarily wet-etching the substrate using an aqueous solution containing hydrofluoric acid.

The organic carbon film layer refers to a film layer which has a carbon content of 30 to 100%. Both spin coating and a chemical or physical deposition method are capable of being used to form the film layer.

Among organic carbon film layers, the spin coating thickness of the SOC that is obtainable using the spin coating is not particularly limited, but the coating thickness may be 100 to 30,000 Å, and a bake process may be performed at a temperature of 150 to 400° C. for 1 to 5 minutes.

The SiON that is capable of being formed using the chemical or physical deposition method may be formed to a thickness of 100 to 10000 Å under pressure of 0.01 to 10 ton using a plasma in a deposition apparatus.

The hydrofluoric-acid-resistant reinforcing material is polyimide, polyethylene, polypropylene, polyvinylidene, polyvinyl chloride, polyimidazole, polycarbonate, polystyrene, polyethylene terephthalate, polybutylene terephthalate, polyphenylene ether, or polyvinylidene fluoride. The hydrofluoric-acid-resistant reinforcing material may be any material that has resistance to hydrofluoric acid and is capable of being selectively applied on the organic carbon film.

The spin coating thickness of the hydrofluoric-acid-resistant reinforcing material may be 10 to 1,000 Å, and a bake process may be performed at a temperature of 50 to 400° C. for 1 to 5 minutes.

When the spin coating thickness of the hydrofluoric-acid-resistant reinforcing material is less than 10 Å, since coating of the organic carbon film is reduced, the organic carbon film is etched by the hydrofluoric acid during an etching process using a hydrofluoric acid solution. Accordingly, a desired etching form is not obtained.

Meanwhile, when the spin coating thickness of the hydrofluoric-acid-resistant reinforcing material is more than 1000 Å, the hydrofluoric-acid-resistant coating material physically fills a space between the organic carbon film layers, in which the size of the pattern to be etched is tens to hundreds of nm, that is, a space between the patterns. Accordingly, it is impossible to perform etching using the hydrofluoric acid solution, so the above thickness is not applicable.

Therefore, the inventor of the present invention found that the spin coating thickness of the hydrofluoric-acid-resistant reinforcing material is preferably 10 to 1000 Å.

Further, the size of the pattern to be etched depends on the spin coating thickness of the hydrofluoric-acid-resistant reinforcing material applied on the organic carbon film. Accordingly, the inventor of the present invention confirmed that the spin coating thickness of the hydrofluoric-acid-resistant reinforcing material applied on the organic carbon film is preferably 10% or less of the size of the organic film pattern in consideration of an etch margin of tens to hundreds of nm in the organic carbon film layer. As a result of research, it was found that the spin coating thickness of the hydrofluoric-acid-resistant reinforcing material is more preferably 10 to 500 Å.

The details of the purpose, technical configuration and the operational effects thereof according to the present invention can be more clearly understood by the following detailed description with reference to the preferred Examples of the present invention.

In a process of the present invention, first, a SOC (spin on carbon; a polymer aqueous solution mainly including carbon) layer, which is an organic carbon film, is applied on a substrate layer, a SiON layer, which is an inorganic film, is deposited using a chemical vapor deposition method, and a photoresist is applied thereon, followed by exposure, thus forming a mask.

Among organic carbon film layers, the spin coating thickness of the SOC that is obtainable using the spin coating is not particularly limited, but the coating thickness may be 100 to 30,000 Å, and a bake process may be performed at a temperature of 150 to 400° C. for 1 to 5 minutes.

The SiON that is capable of being formed using the chemical or physical deposition method may be formed to a thickness of 100 to 10,000 Å under pressure of 0.01 to 10 ton using a plasma in a deposition apparatus.

Primary dry-etching is performed with an etching gas that is capable of etching the deposited film using the formed mask. In the primary dry-etching, complete etching, in which the total depth of the pattern to be formed is obtained, is not performed, but partial etching is performed.

Next, the substrate that is primarily dry-etched is treated with a hydrofluoric-acid-resistant reinforcing material and baked.

The hydrofluoric-acid-resistant reinforcing material is polyimide, polyethylene, polypropylene, polyvinylidene, polyvinyl chloride, polyimidazole, polycarbonate, polystyrene, polyethylene terephthalate, polybutylene terephthalate, polyphenylene ether, or polyvinylidene fluoride. The hydrofluoric-acid-resistant reinforcing material may be any material that has resistance to hydrofluoric acid and is capable of being selectively applied on the organic carbon film.

The spin coating thickness of the hydrofluoric-acid-resistant reinforcing material is not particularly limited. However, the coating thickness need to be 10 to 1,000 Å and preferably 10 to 500 Å, and a bake process may be performed at a temperature of 50 to 400° C. for 1 to 5 minutes.

The hydrofluoric-acid-resistant reinforcing material reacts with the surface of SOC, which is an organic film layer, during the baking to form a thin coating film. This coating film acts as a protective film during secondary wet-etching using an aqueous solution containing hydrofluoric acid.

The next step is a step of secondarily wet-etching the substrate, thus completing the pattern of the film. The secondary wet-etching is performed with the aqueous solution containing the hydrofluoric acid using the formed protective film to thus obtain a desired pattern, and the pattern is completed using an ashing process.

The aqueous solution containing the hydrofluoric acid of the secondary wet-etching is sprayed at a speed of 15 mL/s at 100 rpm for 10 seconds and a wafer is then left to stand for 30 seconds (puddle), followed by rotation of the wafer for 20 seconds with the number of rotation of 2000 rpm, thereby completing pattern formation.

In the above, a preferred method of carrying out the present invention has been specifically described.

Hereinafter, preferred Examples and Comparative Examples of the present invention will be described. However, the following Examples are only preferred examples of the present invention, and the present invention is not limited to the following Examples.

MODE FOR INVENTION

Examples 1 to 7 and Comparative Examples 1 to 6

Example 1

A SOC (spin on carbon; a polymer aqueous solution mainly including carbon) layer, which was an organic carbon film, was applied to a thickness of 1,000 Å on a substrate layer, a bake process was performed at a temperature of 400° C. for 3 minutes, and a SiON layer, which was an inorganic film, was deposited to a thickness of 300 Å using a chemical vapor deposition method. Thereafter, a photoresist for KrF was applied thereon to a thickness of 2,000 Å, followed by exposure at 24 mj using a Nikon 204B KrF exposure apparatus, thus forming a mask having a pattern size of 200 nm.

The deposited film was primarily dry-etched with a CF4-mixed etching gas using the formed mask so that the remaining organic carbon film layer had a thickness of 500 Å. The substrate that was primarily dry-etched was then coated with an organic solvent solution containing 0.1 wt % of polyimide according to a spin coating method, and was baked at 200° C. for 2 minutes, whereby the polyimide was applied to a thickness of 10 Å.

The aqueous solution containing the hydrofluoric acid of the secondary wet-etching was sprayed at a speed of 15 mL/s at 100 rpm for 10 seconds and a wafer is then left to stand for 30 seconds (puddle), followed by rotation of the wafer for 20 seconds with the number of rotation of 2000 rpm, thereby completing a process of forming the pattern.

Example 2

The primarily dry-etched substrate was coated with an organic solvent solution containing 0.5 wt % of polyimide using the same method as in Example 1, thus forming the polyimide in a thickness of 100 Å.

A subsequent treatment process was performed in the same manner as in Example 1 to complete pattern formation.

Example 3

The primarily dry-etched substrate was coated with an organic solvent solution containing 3 wt % of polyimide using the same method as in Example 1, thus forming the polyimide in a thickness of 500 Å.

A subsequent treatment process was performed in the same manner as in Example 1 to complete pattern formation.

Example 4

The primarily dry-etched substrate was coated with an organic solvent solution containing 7 wt % of polyimide using the same method as in Example 1, thus forming the polyimide in a thickness of 700 Å.

A subsequent treatment process was performed in the same manner as in Example 1 to complete pattern formation.

Example 5

The primarily dry-etched substrate was coated with an organic solvent solution containing 7 wt % of polyimide using the same method as in Example 1, thus forming the polyimide in a thickness of 1,000 Å.

Example 6

The primarily dry-etched substrate was coated with an organic solvent solution containing 0.1 wt % of polyimidazole using the same method as in Example 1 except that a hydrofluoric-acid-resistant reinforcing material was changed, thus forming the polyimidazole in a thickness of 10 Å.

A subsequent treatment process was performed in the same manner as in Example 1 to complete pattern formation.

Example 7

The following procedure was performed in order to confirm the loss of an organic carbon film and the extent of silicon etching according to an etching time.

The primarily dry-etched substrate was coated with an organic solvent solution containing 0.1 wt % of polyimidazole using the same method as in Example 1, thus forming the polyimidazole in a thickness of 10 Å.

An aqueous solution containing hydrofluoric acid of secondary wet-etching was sprayed at a speed of 15 mL/s at 100 rpm for 120 seconds and a wafer was then left to stand for 60 seconds (puddle), followed by rotation of the wafer for 20 seconds with the number of rotation of 2000 rpm, thereby completing pattern formation.

Comparative Example 1

Coating of the primarily dry-etched substrate with a hydrofluoric-acid-resistant material, such as polyimide, using the same method as in Example 1 was not performed.

As a subsequent treatment process, wet etching was performed in the same manner as in Example 1.

Comparative Example 2

The primarily dry-etched substrate was coated with an organic solvent solution containing 0.1 wt % of polyimide using the same method as in Example 1, thus forming the polyimide in a thickness of 7 Å.

As a subsequent treatment process, wet etching was performed in the same manner as in Example 1.

Comparative Example 3

The primarily dry-etched substrate was coated with an organic solvent solution containing 0.1 wt % of polyimide using the same method as in Example 1, thus forming the polyimide in a thickness of 7 Å.

An aqueous solution containing hydrofluoric acid of secondary wet-etching was sprayed at a speed of 15 mL/s at 100 rpm for 120 seconds and a wafer was then left to stand for 60 seconds (puddle), followed by rotation of the wafer for 20 seconds with the number of rotation of 2,000 rpm, thereby completing pattern formation.

Comparative Example 4

The primarily dry-etched substrate was coated with an organic solvent solution containing 7 wt % of polyimide using the same method as in Example 1, thus forming the polyimide in a thickness of 1,100 Å.

As a subsequent treatment process, wet etching was performed in the same manner as in Example 1.

Comparative Example 5

The primarily dry-etched substrate was coated with an organic solvent solution containing 7 wt % of polyimide using the same method as in Example 1, thus forming the polyimide in a thickness of 1,300 Å.

As a subsequent treatment process, wet etching was performed in the same manner as in Example 1.

Comparative Example 6

The primarily dry-etched substrate was coated with an organic solvent solution containing 7 wt % of polyimide using the same method as in Example 1, thus forming the polyimide in a thickness of 1,500 Å.

As a subsequent treatment process, wet etching was performed in the same manner as in Example 1.

Evaluation of Examples and Comparative Examples

From the results of Examples 1 to 5, it was confirmed that when the spin coating thickness of the hydrofluoric-acid-resistant reinforcing material applied on the organic carbon film was 10 to 1,000 Å, a silicon pattern having a width of 200 μm and a depth of 1.2 μm was capable of being formed without losing the remaining organic carbon film layer.

Further, in Example 6 in which polyimidazole was treated using a hydrofluoric-acid-resistant coating material, the same results as in Examples 1 to 5 were confirmed. Moreover, although not described as an Example, it was confirmed that other hydrofluoric-acid-resistant coating materials also showed the same results.

In addition, it was confirmed that in the case of Example 7 in which a treatment time using a hydrofluoric acid solution was increased, a silicon pattern having a width of 208 µm and a depth of 15 µm was capable of being formed without losing the remaining organic carbon film layer.

In contrast, in the case of Comparative Example 1, the wet etching was performed without applying a hydrofluoric-acid-resistant material, such as polyimide, on the primarily dry-etched substrate, and it was confirmed that the organic carbon film layer was completely lost by hydrofluoric acid, so it was impossible to form a silicon pattern.

In the case of Comparative Example 2, polyimide was applied to a thickness of 7 Å, and it was confirmed that the organic carbon film layer, which was formed by coating, partially collapsed, so a silicon pattern having a width of 200 µm and a depth of 1.2 µm was incompletely formed.

In the case of Comparative Example 3 which was obtained by increasing an etching time in Comparative Example 2, it was confirmed that the organic carbon film layer was completely lost when the etching time was increased as described above, so it was impossible to form a silicon pattern.

When polyimide was applied to a thickness of 1,100 Å in the case of Comparative Example 4 and 1,300 Å in the case of Comparative Example 5, a silicon pattern was scarcely formed. In the case of Comparative Example 6, polyimide was applied to a thickness of 1,500 Å, and in this case, no silicon pattern was formed.

In addition, when checking the cross sections of Comparative Examples 4 to 6, it was confirmed that a hydrofluoric-acid-resistant coating material filled a space between the patterns of the organic carbon film layer, which protected the silicon layer to be etched by coating the silicon layer.

Through the summary of the results of the Examples and the Comparative Examples, it is evaluated that the pattern is incompletely formed or it is impossible to form the pattern in Comparative Examples 2 to 6 in which the coating thickness of the hydrofluoric-acid-resistant material deviates from the range of 10 to 1,000 Å.

In addition, a maximum coatable thickness is based on that the size of the pattern must be considered. The silicon pattern having a width of 200 µm and a depth of 1.2 µm is completely formed in the coating thickness range of 10 to 1,000 Å. Coating performed in a low thickness range of preferably 10 to 500 Å was evaluated to be good in stability in terms of processes and more economical in terms of costs.

The invention claimed is:

1. A method of forming a silicon pattern in an etching process of a silicon layer in a semiconductor-manufacturing process, the method comprising:
    i) sequentially layering an organic film and an inorganic film on an object to be etched, applying a photoresist for pattern formation thereon, and performing exposure and developing, thus forming a photoresist pattern;
    ii) performing dry etching with a gas that is capable of being used for etching using the formed photoresist pattern so that a portion of an organic carbon film remains directly on the object to be etched;
    iii) applying a hydrofluoric-acid-resistant material on a remaining portion of the organic carbon film;
    iv) performing a bake process at a temperature of 50° C. to 400° C. for 1 to 5 minutes; and
    v) performing wet etching using an aqueous solution containing hydrofluoric acid,
    wherein a coating thickness of the hydrofluoric-acid-resistant material is 10 to 1,000 Å.

2. The method of claim 1, wherein the layering the organic film and the inorganic film on the object to be etched includes a coating method or a chemical or physical deposition method.

3. The method of claim 1, wherein a carbon content of the organic carbon film layered on the object to be etched is 30 to 100%.

4. The method of claim 1, wherein a light source for forming the silicon pattern has a wavelength of 13.5 nm, 198 nm, 248 nm, or 365 nm and includes an E-beam.

5. The method of claim 1, wherein as the gas that is capable of being used for the dry etching after the pattern is formed, an inert gas including argon and nitrogen, a gas including molecules containing one or more fluorine elements, and an oxygen gas are used alone or in combination.

6. The method of claim 1, wherein the hydrofluoric-acid-resistant material is a material that is capable of being selectively applied on the organic carbon film, and polyimide, polyethylene, polypropylene, polyvinylidene, polyvinyl chloride, polyimidazole, polycarbonate, polystyrene, polyethylene terephthalate, polybutylene terephthalate, polyphenylene ether, and polyvinylidene fluoride are used alone or in combination.

7. The method of claim 1, wherein the hydrofluoric-acid-resistant material is applied to a thickness of 10 to 500 Å.

* * * * *